(12) United States Patent
Badrieh et al.

(10) Patent No.: US 11,081,161 B2
(45) Date of Patent: Aug. 3, 2021

(54) SENSING AND TUNING FOR MEMORY DIE POWER MANAGEMENT

(71) Applicant: Micron Technology, Inc., Boise, ID (US)

(72) Inventors: Fuad Badrieh, Boise, ID (US); Thomas H. Kinsley, Boise, ID (US); Baekkyu Choi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 16/185,464

(22) Filed: Nov. 9, 2018

(65) Prior Publication Data
US 2020/0152255 A1  May 14, 2020

(51) Int. Cl.
*G11C 5/14* (2006.01)
*G11C 11/4074* (2006.01)

(52) U.S. Cl.
CPC .................... *G11C 11/4074* (2013.01)

(58) Field of Classification Search
CPC ..... G11C 11/4074; G11C 5/147; G11C 19/50; G11C 2029/5004; B66B 1/28; B66B 7/1223; B66B 9/00
USPC ........................................................ 365/226
See application file for complete search history.

(56) References Cited

U.S. PATENT DOCUMENTS

| | | | |
|---|---|---|---|
| 9,189,053 B2 * | 11/2015 | Cui | G06F 11/07 |
| 9,852,808 B2 * | 12/2017 | Qian | G11C 29/12015 |
| 2015/0106634 A1 * | 4/2015 | Kokai | G06F 1/26 713/300 |
| 2017/0075611 A1 * | 3/2017 | Choi | G06F 3/0625 |
| 2017/0124007 A1 | 5/2017 | Zehavi et al. | |
| 2017/0201263 A1 * | 7/2017 | Lee | H03M 1/0604 |
| 2018/0187617 A1 * | 7/2018 | Shutty | F02D 41/0007 |

* cited by examiner

*Primary Examiner* — Hoai V Ho
*Assistant Examiner* — Minh Dinh
(74) *Attorney, Agent, or Firm* — Holland & Hart LLP

(57) ABSTRACT

Techniques, apparatus, and devices for managing power in a memory die are described. A memory die may include an array of memory cells and one or more voltage sensors. Each voltage sensor may be on the same substrate as the array of memory cells and may sense a voltage at a location associated with the array. The voltage sensors may generate one or more analog voltage signals that may be converted to one or more digital signals on the memory die. In some cases, the analog voltage signals may be converted to digital signals using an oscillator and a counter on the memory die. The digital signal may be provided to a power management integrated circuit (PMIC), which may adjust a voltage supplied to the array based on the digital signal.

19 Claims, 8 Drawing Sheets

SENSING AND TUNING FOR MEMORY DIE POWER MANAGEMENT

BACKGROUND

The following relates generally to a system that includes at least one memory device and more specifically to techniques for sensing and tuning for memory die power management.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. In some memory systems, a power management integrated circuit (PMIC) may be used to manage power applications of memory devices.

DETAILED DESCRIPTION

Figure 1:
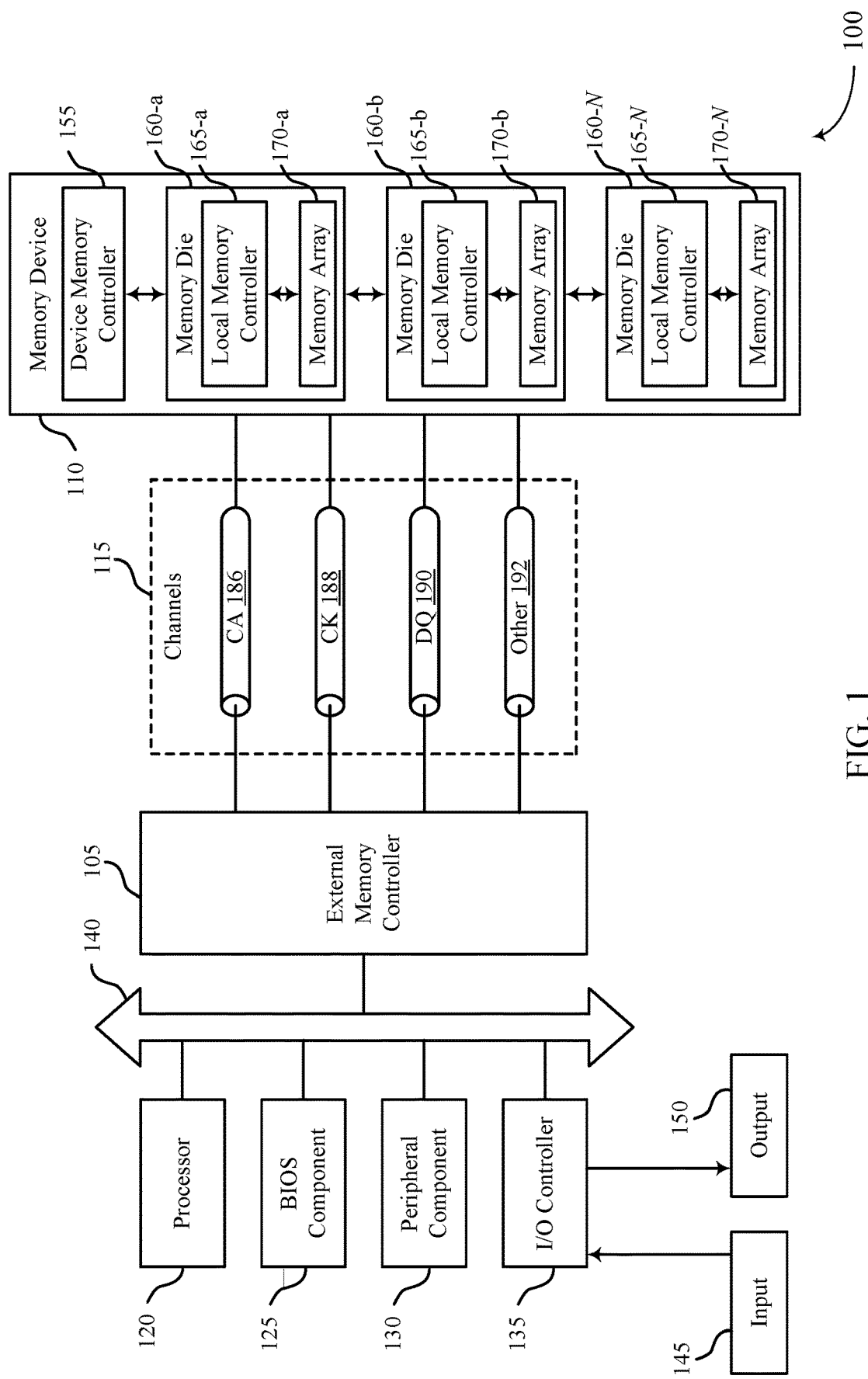
FIG. 1 illustrates an example of a system that supports sensing and tuning for memory die power management as disclosed herein.

Some memory devices may use a power management integrated circuit (PMIC) to supply a voltage to a memory die on the device. The PMIC may be part of a package that includes the memory die. In some cases, the PMIC may be on a different die or substrate than the memory array.

In some cases, voltage sensors may be used at the pins (e.g., at input/output terminals) of a memory device to help regulate the supply voltage. Due to the positioning, such sensors may not capture operating conditions close to or within the memory array itself. The operating conditions at, near, or within the memory array may vary considerably from the operating conditions measured at the pins of the device. In some cases, severe operating conditions in the memory array may cause performance degradation of the memory device or may, in some cases, cause the memory device to malfunction. For example, if the voltage, current, or temperature at, near, or within the memory array exceeds certain threshold conditions, the memory device may malfunction.

A device may be configured to avoid or mitigate malfunctions by managing power supplied to a memory array or regulating the voltage supplied to the memory array. Some voltage regulation may rely on sensing operating conditions at the pins of the memory device and adjusting the supply voltage based on these conditions. As noted above, however, operating conditions nearer to the memory array may be worse than operating conditions at the pins. Thus, monitoring the operating conditions at, near, or within the memory array may provide benefits relative to sensing at the pins or at other locations off of the memory die. For example, such monitoring could potentially be used to provide a feedback signal to a PMIC to enable the PMIC to tune (e.g., provide better regulation of) the supply voltage based on internal (e.g., on-die) conditions of the memory array. Such monitoring could also be used to provide a feedback signal to a host processor or to a thermal regulation system (e.g., a cooling fan, etc.) to enable such elements to regulate other aspects of the memory device more effectively than using sensing at the pins of the memory device.

Sensing the operating conditions closer to the memory array—such as at a location on the die that is near or within the memory array—to generate a feedback signal may present some challenges. For example, the sensor may produce an analog signal that may need to be transmitted off the die (e.g., to a PMIC, to a host controller, to a thermal regulator, etc.). Transmitting this signal may cause additional conductive lines to be added to the memory die or memory device (e.g., conductive lines originating at the sensing location) or additional input/output pins to provide the feedback signal to the PMIC or host. In addition, noise (e.g., distortion) may be introduced to the feedback signal during transmission on the die due to thermal conditions, parasitic conditions, self and mutual capacitance, and/or interference from other on-die signals or components, potentially degrading or corrupting the feedback signal.

One approach for mitigating the effects of on-die noise introduced into the feedback signal may be to convert the feedback signal from an analog signal to a digital signal as described herein. A digital feedback signal may be less susceptible to interference from on-die noise sources and may preserve the sensed voltage information. In some cases, an analog signal may be converted, on the memory die, to a digital feedback signal using an on-die oscillator and a counter, as described herein. Such an approach may enable accurate feedback of the operating conditions at, near, or within a memory array (e.g., on the memory die), thereby potentially enabling off-die or off-chip components (such as a PMIC, controller, or other component) to implement new or better regulation algorithms.

Techniques for sensing and tuning for memory die power management are described herein. These techniques may include sensing, by a first sensor on a substrate (e.g., on a memory die), a voltage at a location of a memory array on the substrate and generating, based at least in part on the sensed voltage, a digital feedback signal indicative of the first voltage sensed at the location, and transmitting the digital feedback signal to a PMIC for adjusting a second voltage supplied to the memory array.

Figure 2:
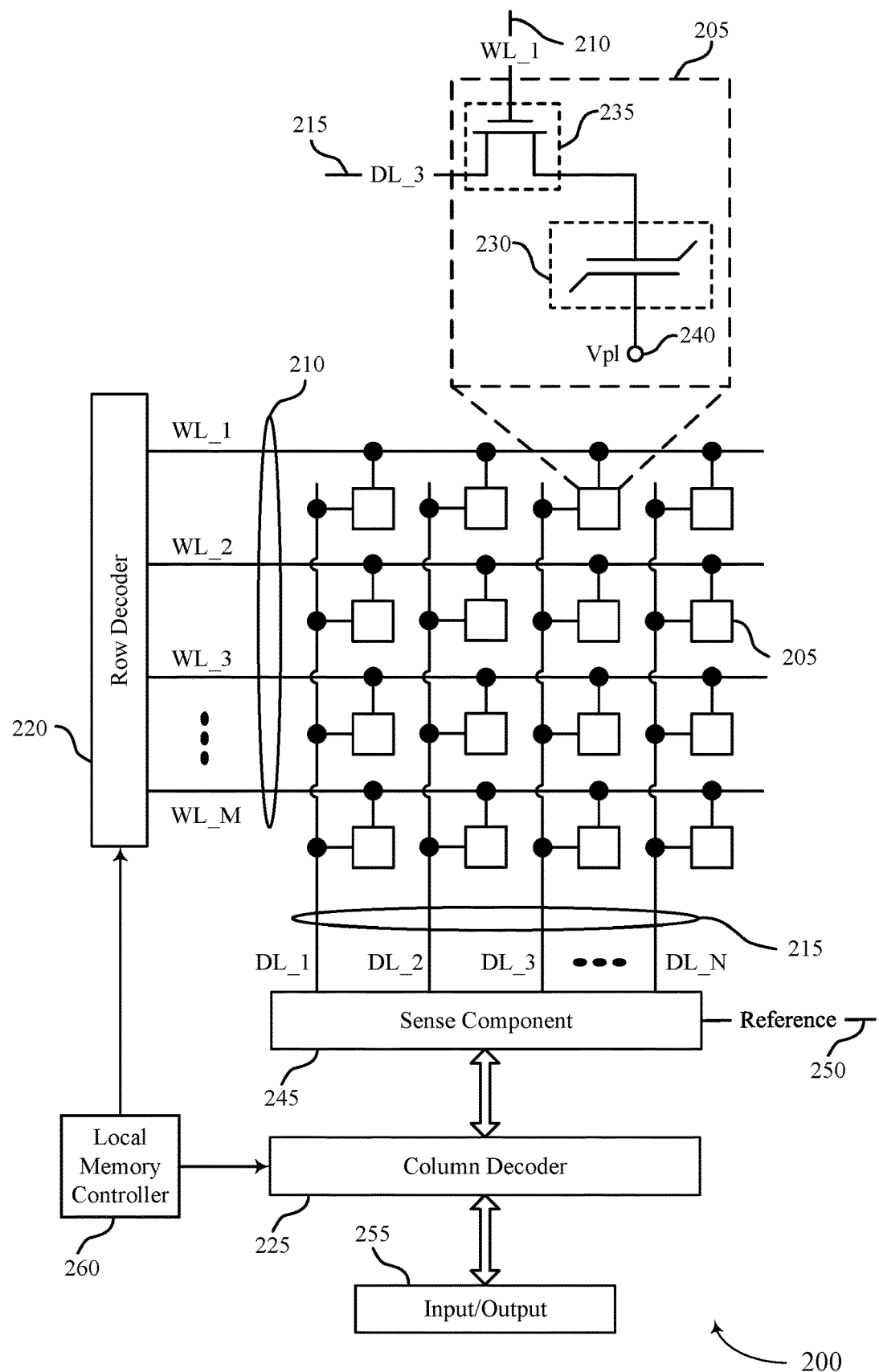
FIG. 2 illustrates an example of a memory die that supports sensing and tuning for memory die power management as disclosed herein.

Features of the disclosure are initially described in the context of a memory system in FIGS. 1 and 2. Features of the disclosure are described in the context memory systems, circuits, and timing diagrams in FIGS. 3 through 5. These and other features of the disclosure are further illustrated by and described with reference to FIGS. 6 through 8 that include an apparatus diagram and flowcharts that relate to techniques for sensing and tuning for memory die power management.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105.

For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

In some cases, the memory device 110 may be configured to transmit a digital feedback signal to a PMIC (or other device) using one or more feedback pins of the memory device 110. The feedback pins may be coupled with the PMIC using a conductive feedback path. In some cases, the digital feedback signal may indicate a voltage sensed at the memory array by one or more voltage sensors. In some cases, the voltage sensor(s) may be located on the same die as the memory array; e.g., the voltage sensors may be on the same substrate as the memory array.

FIG. 2 illustrates an example of a memory die 200 in accordance with various examples of the present disclosure. The memory die 200 may be an example of memory dice 160 described with reference to FIG. 1. In some cases, the memory die 200 may be referred to or be a portion of a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison.

For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the memory die 200 may be configured to transmit a feedback signal to a PMIC using one or more feedback pins of the memory die 200. The feedback pins may be coupled with the PMIC using a conductive feedback path. In some cases, the digital feedback signal may indicate a voltage sensed at the memory array by one or more voltage sensors. In some cases, the voltage sensor(s) may be located on the same die as the memory array; e.g., the voltage sensors may be on the same substrate as the memory array.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

Figure 3:
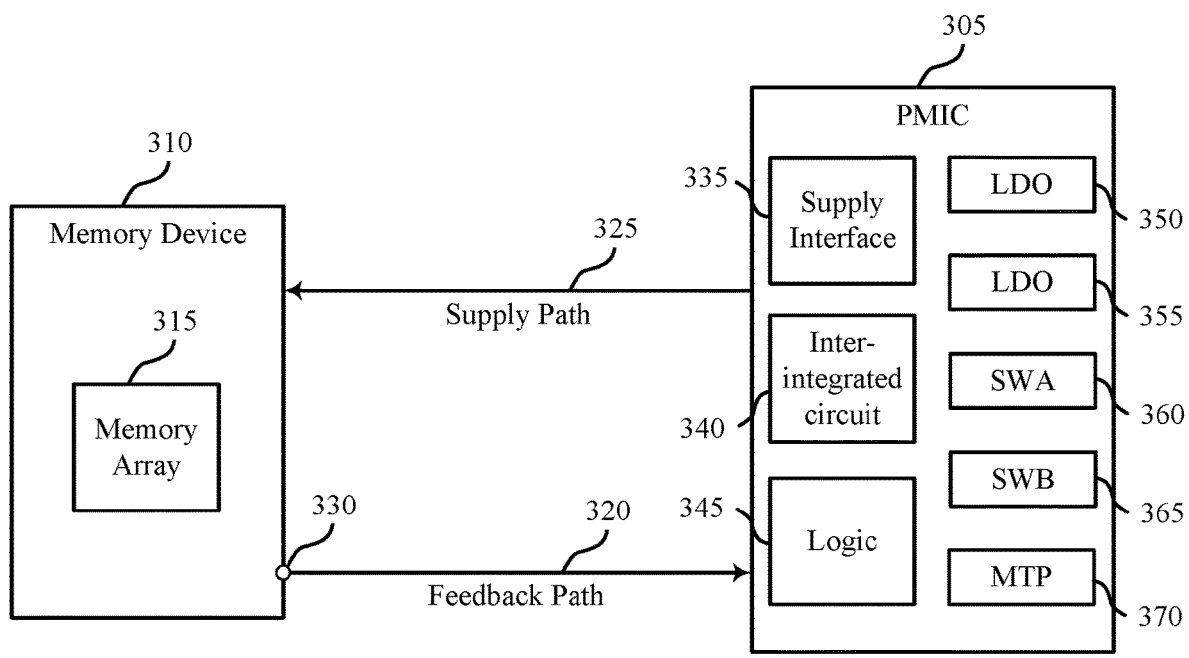
FIG. 3 illustrates an example of a memory system that supports sensing and tuning for memory die power management as disclosed herein.

FIG. 3 illustrates an example of a memory system 300 that supports sensing and tuning for memory die power management. The memory system 300 may include a PMIC 305, a memory device 310 that includes a memory array 315, and a feedback path 320 and supply path 325 between the PMIC 305 and the memory device 310. In the example of the memory system 300, the feedback path 320 and/or supply path 325 may be an example of conductive lines that couple the PMIC 305 with the memory device 310. The memory device 310 may be an example of a memory device 110 as described with reference to FIG. 1. Memory array 315 may be an example of memory array 170 as described with reference to FIG. 1.

The PMIC 305 may include a supply interface 335, an inter-integrated circuit 340, logic 345, low-dropout regulators (LDO) 350, 355, power supplies (SWA, SWB) 360, 365 (e.g., switching regulators), and multi-time programmable memory (MTB) 370. The supply interface 335 may be configured to receive power to activate the PMIC 305 and be distributed to other components of a memory system (e.g., memory device 310) through the PMIC 305. The inter-integrated circuit 340 may be an example of a bus configured to couple the PMIC 305 with other components. In some cases, the inter-integrated circuit 340 may include a pin configured for receiving a serial clock from another component. The logic 345 may include an analog-to-digital converter, a digital-to-analog converter, an oscillator, or other components, or a combination thereof. Logic 345 may, in some examples, be used for providing feedback to other components in a memory system.

The low-dropout regulators 350, 355 may be used for outputting power (e.g., DC power) to memory devices of the memory system, including memory device 310. In some cases, the low-dropout regulators 350, 355 may be used to regulate an output voltage. The power supplies 360, 365 may be used for outputting power to memory devices of the memory system, including memory device 310. The PMIC 305 may include any quantity of low-dropout regulators (e.g., one, two, three, four, five, six, seven, eight), or may include any quantity of power supplies (e.g., one, two, three, four, five, six, seven, eight), or any quantity of both.

The multi-time programmable memory 370 may be any type of memory used by the PMIC 305 for performing the functions described herein. In some cases, the multi-time programmable memory 370 may be an example of an electrically erasable programmable read-only memory (EEPROM) or other type of memory technology. The multi-time programmable memory 370 may be for protecting circuits, improving a reliability of a power-on sequence or a power-off sequence, setting of output voltage(s), setting of output pull-down resistance(s), or other functions, or any combination thereof.

The memory device 310 may include at least one feedback pin 330. The feedback path 320 may couple the feedback pin 330 of the memory device 310 with the PMIC 305. The feedback path 320 may include any set of one or more lines that establish a communicative link between the memory device 310 and the PMIC 305. The feedback path 320 may directly couple the memory device 310 and the PMIC 305, meaning that the feedback path 320 may establish a connection between the two components that allows a signal to be routed between the components using conductive lines. Supply path 325 may enable the PMIC 305 to provide a supply voltage to memory device 310, for example.

Techniques are provided herein for transmitting a digital feedback signal over the feedback pin 330 and the feedback path 320, which may be used by the PMIC 305 (and/or by another device, such as a host processor) to regulate a voltage supplied to memory device 310 (e.g., over supply path 325) or to regulate another operational aspect of memory device 310.

Figure 4:
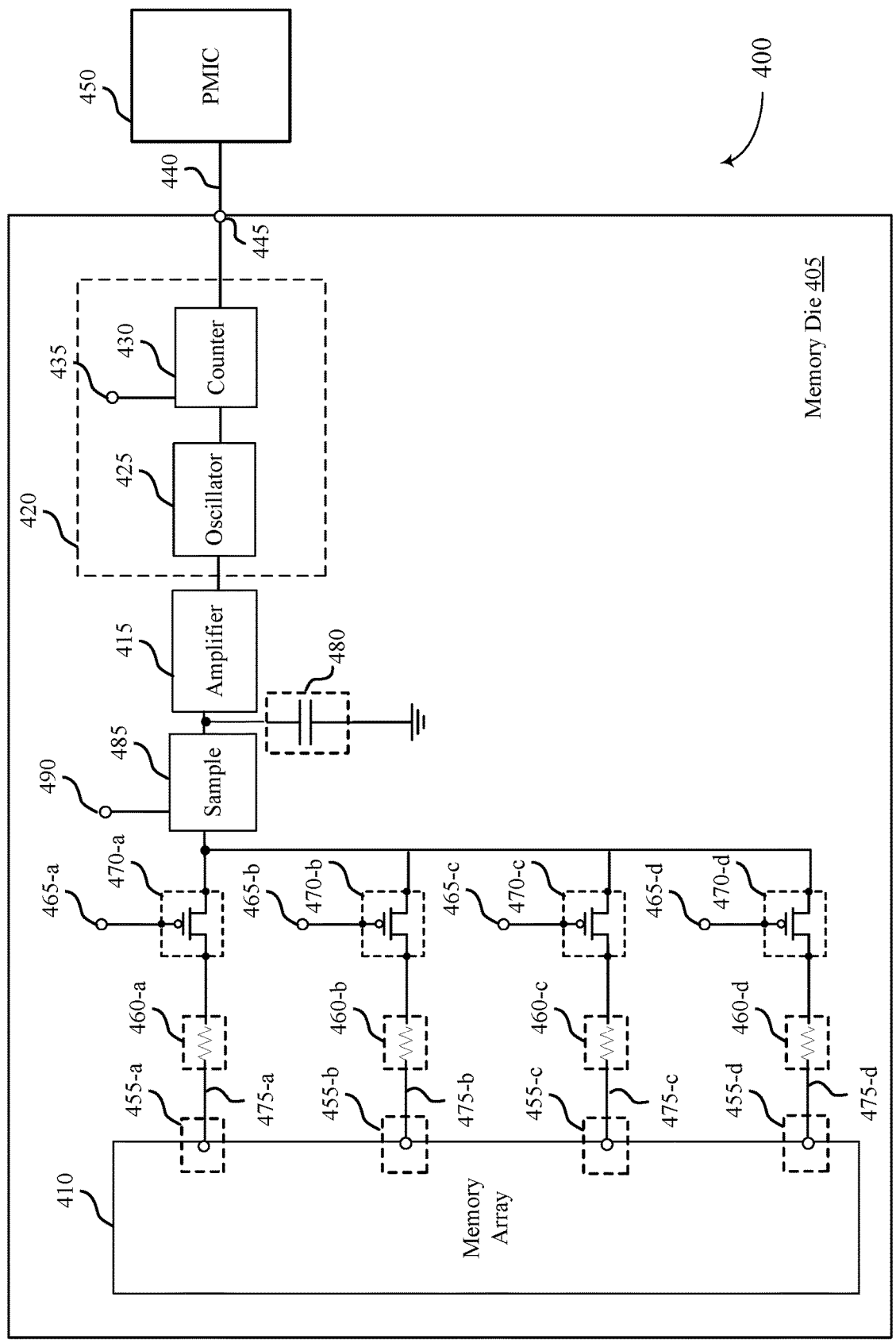
FIG. 4 illustrates an example of a circuit of a memory system that supports sensing and tuning for memory die power management as disclosed herein.

FIG. 4 illustrates an example of a circuit 400 of a memory system that supports sensing and tuning for memory die power management. The circuit 400 may be an example of one or more components of the memory system 300 described with reference to FIG. 3. The circuit 400 may include memory die 405 that includes memory array 410, amplifier 415, and some or all of feedback component 420. Memory die 405 may be on a substrate, for example. Circuit 400 includes PMIC 450, which may, in some cases, be located on a different die (e.g., substrate) than memory die 405, for example. Alternatively, some or all of the circuitry of PMIC 450 may be located on memory die 405.

Circuit 400 includes feedback path 440 that may be used to provide a digital feedback signal from feedback component 420 to PMIC 450. In some cases, the digital feedback signal may be provided to PMIC 450 over a feedback pin 445.

Circuit 400 may include one or more resistors 460-a, 460-b, 460-c, 460-d and one or more switches 470-a, 470-b, 470-c, 470-d. The one or more resistors may represent one or more voltage sensors that may be used for sensing a voltage at one or more locations 455-a, 455-b, 455-c, 455-d associated with memory array 410. In some cases, locations 455 may be on memory die 405 at locations that may be at or near memory array 410 or within memory array 410 (e.g., within the area used by memory array 410). In some cases, resistors 460 may be coupled with locations 455 over conductive paths 475-a, 475-b, 475-c, 475-d, thereby providing voltage sensing on memory die 405. In some cases, additional or alternative components or devices may be used as voltage sensors on memory die 405. While circuit 400 depicts four (4) sets of resistors 460, conductive paths 475, and switches 470 to enable voltage sensing at four (4) locations 455 on memory die 405, the memory die may include more or fewer voltage sensors. For example, a memory die may include a single voltage sensor at a single location 455, or may include six (6), seven (7), eight (8), or more voltage sensors at corresponding (different) locations 455.

Each switch 470 may be activated (e.g., closed) by a corresponding switch control signal 465-a, 465-b, 465-c, 465-d to select a particular location for voltage sensing. In some cases, switches 470 may be or may include transistors, such as the p-type transistors shown in FIG. 4. In some cases, the switches 470 may be n-type transistors.

In operation, one or more conductive paths 475 and resistors 460 may be used to continuously or intermittently sense a voltage at one or more corresponding locations 455 of memory array 410. One or more control signals 465 may be activated to close one or more corresponding switches 470 and thereby select an analog voltage signal that may be sampled by sampling circuitry 485 when sample control signal 490 is activated. The sampled analog voltage signal may be held on capacitor 480, which may be coupled with and serve as a reference voltage for amplifier 415. In some cases, amplifier 415 may use an additional, relatively high voltage supply (e.g., a VPP supply that provides, e.g., 13V) to drive amplifier 415.

Amplifier 415 may condition (e.g., amplify and/or smooth) the sensed analog voltage signal (e.g., as held on capacitor 480) and drive an oscillator 425 using the conditioned analog voltage signal. In some cases, amplifier 415 may thereby serve as a temporary power supply for oscillator 425. The analog voltage signal may represent the voltages sensed at one or more locations in the memory array 410 by the voltage sensors.

In some cases, oscillator 425 may output a signal that includes a series of pulses having a pulse frequency, as described in more detail with reference to FIG. 5. Each pulse may include a transition from a low voltage to a high voltage and/or a transition from a high voltage to a low voltage. The pulse frequency may be the quantity (e.g., number) of pulses over a given time duration, such as over a time period of one second, one millisecond, one nanosecond, etc. The pulse frequency may change (e.g., increase or decrease) based on the voltage of the analog voltage signal received from amplifier 415. For example, a higher analog voltage signal may cause the pulse frequency to increase, while a lower analog voltage signal may cause the pulse frequency to decrease. Thus, the pulse frequency of the oscillator may provide an indication of the voltage of the analog voltage signal, and therefore may also provide an indication of the voltage sensed at a location of memory array 410.

The oscillator 425 may output an analog oscillator signal (e.g., a series of pulses whose frequency depends on the analog voltage signal) that may be provided to counter 430; that is, oscillator 425 may drive the counter 430. Counter 430 may count the quantity of pulses in the oscillator signal over a given duration. The counter 430 may be, for example, an 8-bit counter, a 9-bit counter, or some other type of counter. Counter 430 may be activated by counter control signal 435 to cause counter 430 to begin counting the quantity of pulses of the analog oscillator signal over a given time duration. Counter control signal 435 may be deactivated after the time duration has elapsed to cause counter 430 to cease counting the quantity of pulses. The counter 430 may output a digital feedback signal that indicates the quantity of pulses counted over the time duration based on the counter control signal 435 being deactivated. The digital feedback signal may indicate the voltage sensed at the memory array 410. In some cases, counter 430 may provide the digital feedback signal to PMIC 450 over feedback path 440 and feedback pin 445.

In some cases, a digital feedback signal may be less susceptible to noise than an analog signal, and therefore may be more likely to be accurately received by the PMIC. For example, without the use of feedback component 420, an analog signal may be used to provide feedback information to PMIC 450. In this case, the analog signal may be corrupted or distorted by noise as it travels across the memory die due to, for example, parasitic conditions, self and mutual capacitance, and/or interference from other on-die signals or components on the memory die. Such distortion may reduce the accuracy of the feedback signal and, correspondingly, may reduce the accuracy of the voltage regulation by the PMIC 450. In contrast, a digital feedback signal may retain its accuracy even in the presence of noise; e.g., a digital feedback signal may be less susceptible to on-die noise sources.

In some cases, oscillator 425 may be pre-characterized to determine a mapping of input oscillator voltages to output pulse frequencies. In some cases, such a mapping may be affected by semiconductor process variations; e.g., the mapping may be different for oscillators on different memory die 405. In some cases, the oscillator 425 may be characterized during an initial testing protocol for memory die 405, by (for example) applying a range of voltages and determining corresponding pulse frequencies of the oscillator's output signal. In some cases, such mapping may be done before the memory die 405 is packaged, sold, and/or operated within a product.

PMIC 450 may receive the digital feedback signal from counter 430. PMIC 450 may map the digital feedback signal to a voltage using the above-described mapping, and determine whether the voltage is higher or lower than a voltage threshold, which may be, for an example, a desired voltage associated with operating the memory array. PMIC 450 may adjust a voltage supplied to memory die 405 and/or memory array 410 based on the determination. For example, if the digital feedback signal indicates that the sensed voltage at memory array 410 is higher than a voltage threshold (e.g., the quantity of pulses is higher than a threshold or desired quantity of pulses), PMIC 450 may decrease the supply voltage provided to memory die 405 and/or memory array 410. If the digital feedback signal indicates that the sensed voltage at memory array 410 is lower than the voltage threshold (e.g., the quantity of pulses is lower than a threshold or desired quantity of pulses), PMIC 450 may increase the supply voltage provided to memory die 405 and/or memory array 410.

In some cases, memory die 405 may include additional circuitry that may perform an operation on multiple sensed voltages from multiple locations 455 at memory array 410. Such circuitry may, for example, determine an average of the multiple sensed voltages such that the analog voltage signal provides an indication of the average voltage sensed at memory array 410. Such circuitry may, for example, determine or select a minimum voltage or a maximum voltage of the multiple sensed voltages such that the analog voltage signal provides an indication of the minimum or maximum sensed voltage. In this manner, the digital feedback signal provided to the PMIC 450 may provide an indication of operating conditions (e.g., voltages) at multiple locations of memory array 410, thereby enabling the PMIC 450 to adjust a supply voltage accordingly.

In some cases, circuit 400 may include additional circuitry on the memory die 405 that may map the quantity of pulses counted by counter 430 to a corresponding estimated voltage (e.g., an estimation of the voltage sensed at the location) using the pre-characterized mapping of the oscillator 425 described herein. In this case, the feedback signal may include an indication of the expected voltage instead of or in addition to an indication of the quantity of pulses.

In some cases, the speed of the oscillator 425 may be controlled or determined by additional circuitry on the memory die 405 rather than being directly driven by amplifier 415. In such cases, a controller or other element on memory die 405 may set the oscillator speed, based on the sensed voltage, such that the pulse frequency of the oscillator is always or often high enough to enable an accurate determination of the frequency when counted over a reasonably short time period (e.g., with a reasonably small amount of delay).

In some cases, circuit 400 may include additional circuitry that may be used to control a duration over which the voltage at the location is sensed (e.g., to control the sampling time). In such cases, the sampling time may be adjusted to be shorter or longer based on desired characteristics of the sensed voltage, such as whether it is desirable to capture an instantaneous (or nearly instantaneous) voltage sample or whether it is desirable to captures a temporally averaged voltage.

In some cases, circuit 400 may include additional circuitry that may decompose the sensed voltage into spectral harmonics (tones) using, for example, a Fourier transform. In such cases, the feedback signal may include, for example, Fourier components of the sensed voltage instead of or in addition to the quantity of pulses. In some cases, the PMIC 450 may use such spectral information (Fourier components) to selectively adjust or tune the supply voltage based on the individual harmonics indicated by the feedback signal.

Figure 5:
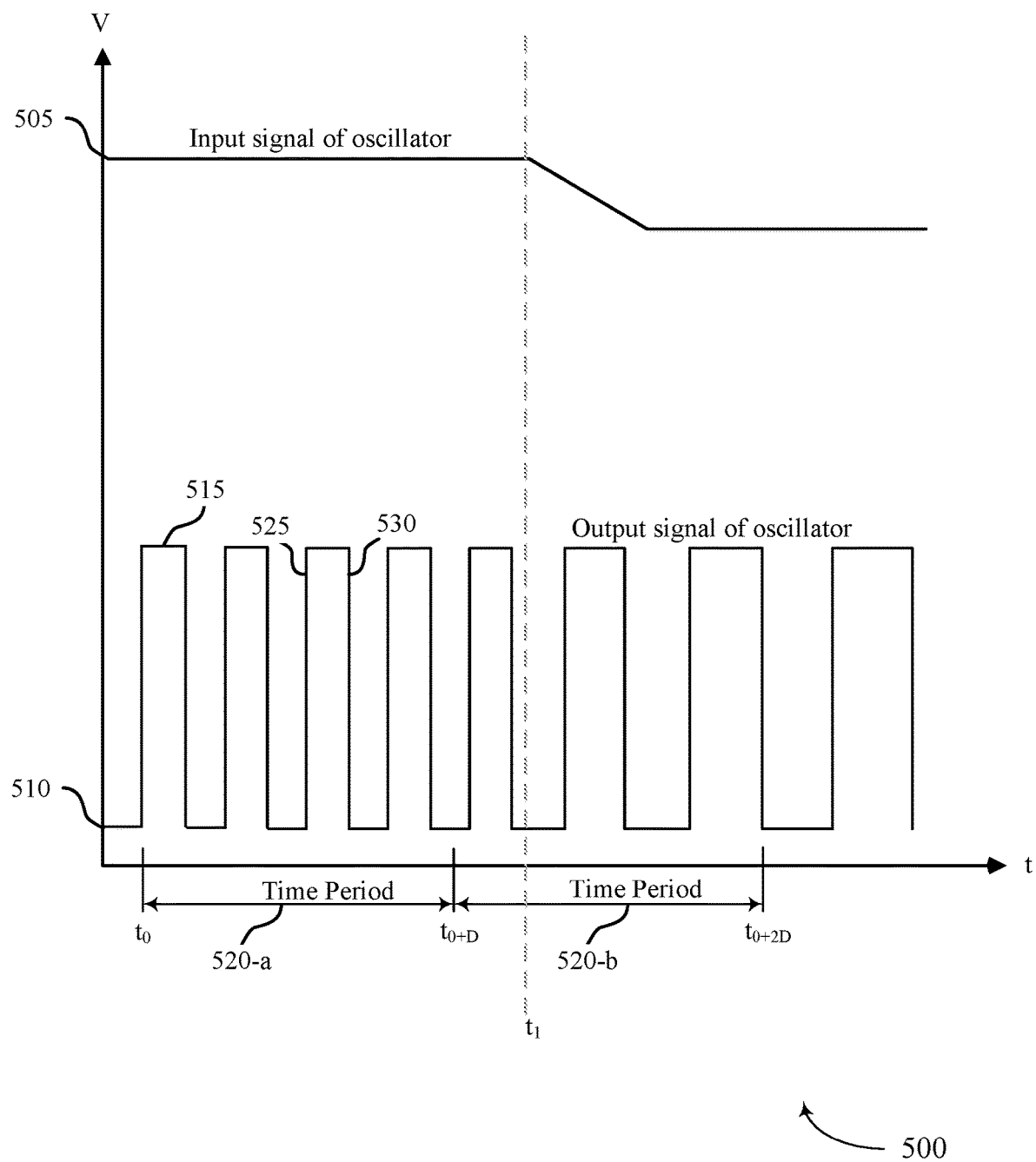
FIG. 5 illustrates an example of a timing diagram that supports sensing and tuning for memory die power management as disclosed herein.

FIG. 5 illustrates a timing diagram 500 for a memory system that supports sensing and tuning for memory die power management. The timing diagram 500 depicts various voltages V that may be seen in, for example, analog signals of circuit 400 over time t during operation of a memory system, such as memory system 100, 300 described with respect to FIGS. 1 and 3.

Timing diagram 500 includes a voltage of an analog voltage signal 505 (e.g., an input signal of an oscillator) and a voltage of an oscillator signal 510 (e.g., an output signal of the oscillator). Analog voltage signal 505 may be provided to an oscillator (e.g., oscillator 425), which may output the oscillator signal 510 in response to receiving the analog voltage signal 505.

Analog voltage signal 505 may represent a voltage sensed at one of more locations associated with a memory array (e.g., at locations 455). Analog voltage signal 505 may initially represent a first voltage, and may decrease to a second voltage at time ti. Oscillator signal 510 may include a series of pulses 515, the frequency of which may be based on the voltage of analog voltage signal 505.

In some cases, a counter (e.g., counter 430) may be activated at time to by activating a counter control signal (e.g., counter control signal 435) to begin counting a quantity of pulses 515 of oscillator signal 510 over a time period (TP) 520. As depicted in timing diagram 500, the pulse frequency of oscillator signal 510 (e.g., the quantity of pulses 515 per second or other duration) may change based on the sensed voltage (e.g., the analog voltage signal 505). For example, during a first time period 520-a, the counter may count four pulses. After the analog voltage signal 505 decreases at time ti, the pulse frequency of the oscillator signal 510 may decrease such that the quantity of pulses 515 counted over the second time period 520-b may be two pulses, which may be fewer than the quantity of pulses counted over the first time period 520-a.

In some examples, a counter may count pulses 515 during a time period 520 based on a quantity of rising edges 525

(e.g., a transition from a lower voltage to a higher voltage). That is, each rising edge 525 may be counted as a pulse 515. In some examples, a counter may count pulses 515 based on a quantity of falling edges 530 (e.g., a transition from a higher voltage to a lower voltage). That is, each falling edge 530 may be counted as a pulse 515. In some cases, a counter may count pulses 515 based on a quantity of pairs of rising edges 525 followed by falling edges 530. That is, each pair of rising edge 525 and falling edge 530 may be counted as a pulse 515.

In the example depicted in FIG. 5, time periods 520-*a*, 520-*b* may be the same (e.g., having the same duration, constant) regardless of the value of analog voltage signal 505. In other examples, a time period 520 may depend on the value of analog voltage signal 505. In general, there may be a trade-off associated with choosing the time period: a shorter time period may reduce the latency associated with providing a digital feedback signal to the PMIC (because less time elapses during the time period) but may also reduce the accuracy of the digital feedback signal (because there may be fewer pulses counted during the time period, and therefore lower resolution or accuracy). In contrast, a longer time period may increase the latency of the digital feedback signal but may increase the accuracy of the digital feedback signal. In some cases, a shorter time period may be appropriate when the pulse frequency is relatively high, while a longer time period may be appropriate when the pulse frequency is relatively low.

In some cases, a controller (e.g., device memory controller 155) may determine the time period (and therefore determine when to activate and deactivate counter control signal 435) based on an accuracy threshold associated with the digital feedback signal. An accuracy threshold may be based on, for example, a minimum amount of time and/or or a minimum quantity of pulses that may enable a determination of a pulse frequency of the oscillator to within a certain accuracy, error rate, or percentage. An accuracy threshold may include, for example, a quantity of pulses, an error rate, an amount of distortion, or some other indication of accuracy. In some cases, the accuracy threshold may be referred to as a distortion threshold.

In some cases, a controller may determine the time period based on a latency threshold associated with the digital feedback signal. A latency threshold may be based on, for example, a maximum latency between when a voltage is sensed at the memory array and when a digital feedback signal is transmitted to the PMIC, for example. A latency threshold may include an amount of time, for example.

In some cases, a controller (e.g., local memory controller 160) may determine the time period (and therefore determine when to activate and deactivate counter control signal 435) based on the value of analog voltage signal 505. For example, the memory controller may increase or decrease the time period (e.g., to have a longer or shorter duration) based on the current or previous analog voltage signal or the current or previous digital feedback signal. Thus, the time period may be a constant duration, or it may be dynamically adjusted based on various operating conditions on the memory die. In some cases, a controller may determine the time period based in part on expected or predicted operating conditions rather than on sensed operating conditions. In some cases, the controller may select the time period from a set of pre-configured time periods.

In some cases, a PMIC (e.g., PMIC 305, 450) may use the mapping to determine, based on a digital feedback signal indicating the pulse frequency, whether a voltage at a location of the memory array is above or below a desired voltage. In some cases, the PMIC may adjust (e.g., increase or decrease) the supply voltage for the memory device based on the determination of whether the voltage at the memory array is higher or lower than the voltage threshold. In some cases, the PMIC may determine whether the voltage is higher or lower than the voltage threshold using logic circuitry, such as logic 345, and may adjust the supply voltage using a low-dropout regulator 350, 355, for example.

Figure 6:
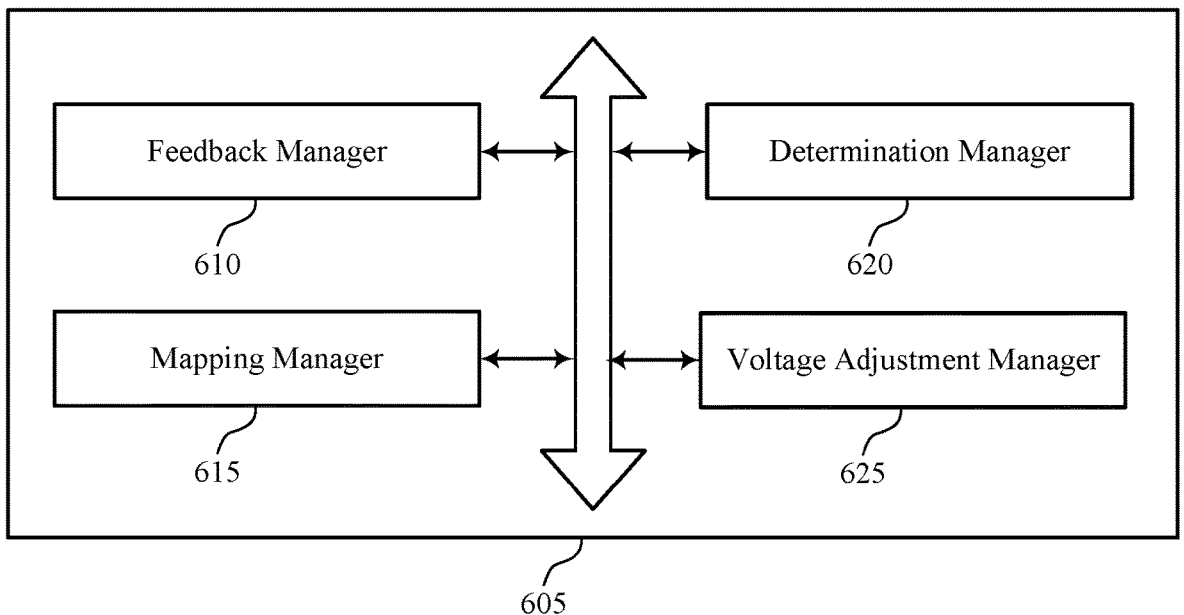
FIG. 6 shows a block diagram of a controller that supports sensing and tuning for memory die power management as disclosed herein.

FIG. 6 shows a block diagram 600 of a controller 605 of a memory system (e.g., a memory system that includes a memory device and a PMIC) or of a PMIC that supports sensing and tuning for memory die power management as described herein. The controller 605 may be an example of aspects of the controllers 105, 155, 165, 260 and/or logic 345 described herein. The controller 605 may include a feedback manager 610, a mapping manager 615, a determination manager 620, and a voltage adjustment manager 625. Each of these modules may communicate, directly or indirectly, with one another (e.g., over one or more buses).

The feedback manager 610 may receive, at a PMIC, a digital feedback signal that indicates a voltage sensed at a location associated with an array of memory cells. The array of memory cells and the location may be on the same substrate; e.g., on the same memory die. In some cases, the digital feedback signal is received from a memory device (e.g., memory device 310) over a feedback pin (e.g., feedback pin 330) and a feedback path (e.g., feedback path 320).

The mapping manager 615 may map the digital feedback signal to a corresponding voltage. In some cases, mapping manager 615 may map the digital feedback signal to the corresponding voltage using a set of predetermined data that characterizes the relationship between an input voltage signal to an oscillator (e.g., an input to oscillator 425 that represents a voltage at the sense location) and an output oscillator signal (e.g., a signal output by oscillator 425) that includes a pulse train having a pulse frequency.

The determination manager 620 may determine whether the corresponding voltage is higher or lower than a voltage threshold. In some cases, determination manager 620 may determine whether the corresponding voltage is higher or lower than the voltage threshold by comparing the corresponding voltage with the voltage threshold. In some cases, the voltage threshold may be a maximum acceptable voltage or a minimum acceptable voltage at which the memory device may operate. In some cases, the voltage threshold may be a range of voltages; e.g., a range of acceptable voltages at which the memory device may operate.

The voltage adjustment manager 625 may adjust a supply voltage supplied to the memory die and/or to the array of memory cells based on the determination of whether the corresponding voltage is higher or lower than the voltage threshold. In some cases, if the corresponding voltage is higher than the voltage threshold, the voltage adjustment manager 625 may decrease the supply voltage. In some cases, if the corresponding voltage is lower than the voltage threshold, the voltage adjustment manager 625 may increase the supply voltage. In some cases, the voltage adjustment manager may adjust the supply voltage using one or more low-dropout regulators (e.g., low-dropout regulators 350, 355), one or more power supplies (e.g., power supply 360, 365), and/or a supply interface (e.g., supply interface 335).

Figure 7:
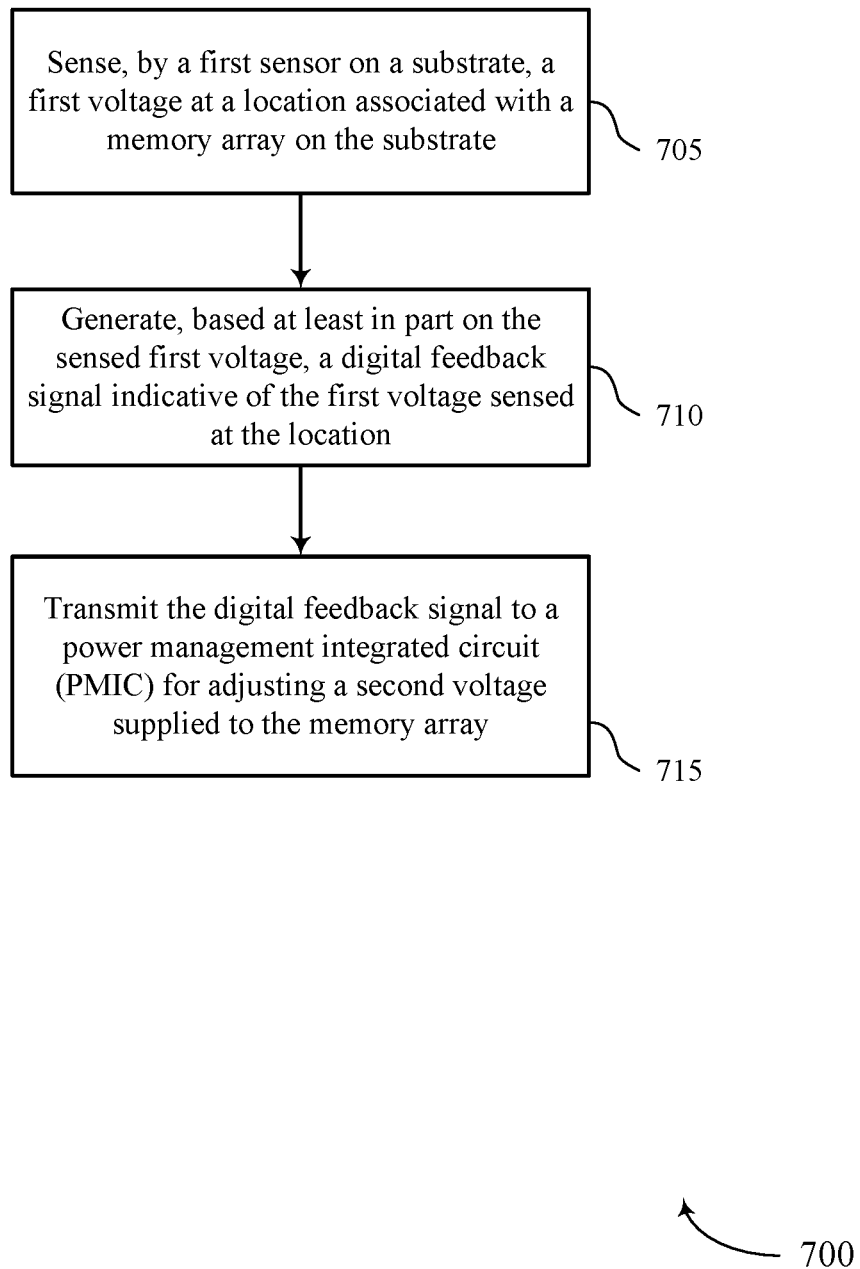
FIGS. 7 and 8 show flowcharts illustrating a method or methods that support sensing and tuning for memory die power management as disclosed herein.

FIG. 7 shows a flowchart illustrating a method 700 that supports sensing and tuning for memory die power management as described herein. The operations of method 700 may be implemented by a memory device or its components as described herein (e.g., a controller of a memory device).

For example, the operations of method 700 may be performed by a memory device as described with reference to FIGS. 1 through 5. In some examples, a memory device may execute a set of instructions to control the functional elements of the memory device to perform the functions described below. Additionally or alternatively, a memory device may perform aspects of the functions described below using special-purpose hardware.

At 705, the memory device may sense, using a first sensor on a substrate, a first voltage at a location of a memory array on the substrate. In some examples, aspects of the operations of 705 may be performed using a conductive path (e.g., conductive path 475) and a resistor (e.g., resistor 460) that are coupled with the location (e.g., location 455) of the memory array, as described with reference to FIG. 4. In some examples, a memory controller of a memory device may activate one or more switches (e.g., switch 470) by activating or asserting a corresponding switch control signal (e.g., control signal 465) as part of a method to sense a voltage at the location.

At 710, the memory device may generate, based on the sensed first voltage, a digital feedback signal indicative of the first voltage sensed at the location. In some examples, aspects of the operations of 710 may be performed by an amplifier (e.g., amplifier 415), oscillator (e.g., oscillator 425), and/or counter (e.g., counter 430) as described with reference to FIGS. 4 through 5. In some examples, a memory controller of a memory device may activate or deactivate the counter using a counter control signal (e.g., counter control signal 435) to begin cause the counter to start or stop counting a quantity of pulses output by the oscillator over a time period as part of generating the digital feedback signal.

At 715, the memory device may transmit the digital feedback signal to a PMIC for adjusting a second voltage supplied to the memory array. In some examples, aspects of the operations of 715 may be performed using a feedback pin (e.g., feedback pin 330, 445) and feedback path (e.g., feedback path 320, 440) as described with reference to FIGS. 3 through 4.

In some examples, an apparatus as described herein may perform a method or methods, such as the method 700. The apparatus may include features, means, or instructions (e.g., a non-transitory computer-readable medium storing instructions executable by a processor) for sensing, by a first sensor on a substrate, a first voltage at a location of a memory array on the substrate; generating, based on the sensed first voltage, a digital feedback signal indicative of the first voltage sensed at the location; and transmitting the digital feedback signal to a PMIC for adjusting a second voltage supplied to the memory array.

Some examples of the method 700 and the apparatus described herein may further include operations, features, means, or instructions for generating an analog voltage signal that indicates the first voltage, where the digital feedback signal is generated based on the analog voltage signal.

Some examples of the method 700 and the apparatus described herein may further include operations, features, means, or instructions for adjusting a pulse frequency of a signal output by an oscillator on the substrate based on the sensed first voltage, and determining a quantity of pulses of the signal output by the oscillator over a time period, where the digital feedback signal is generated based on the quantity of pulses.

Some examples of the method 700 and the apparatus described herein may further include operations, features, means, or instructions for determining the time period based at on an accuracy threshold associated with the digital feedback signal.

Some examples of the method 700 and the apparatus described herein may further include operations, features, means, or instructions for determining the time period based at on a latency threshold associated with the digital feedback signal.

Some examples of the method 700 and the apparatus described herein may further include operations, features, means, or instructions for mapping the digital feedback signal to a corresponding voltage; determining whether the corresponding voltage is higher or lower than a desired voltage; and adjusting the second voltage based on the determination.

Some examples of the method 700 and the apparatus described herein may further include operations, features, means, or instructions for sensing, using a second sensor on the substrate, a third voltage at a second location associated with the memory array, where generating the digital feedback signal is based on the sensed first voltage and the sensed third voltage.

Some examples of the method 700 and the apparatus described herein may further include operations, features, means, or instructions for determining an average of the sensed first voltage and the sensed third voltage, where generating the digital feedback signal is based on the average of the sensed first voltage and the sensed third voltage.

Some examples of the method 700 and the apparatus described herein may further include operations, features, means, or instructions for determining a maximum or a minimum of the sensed first voltage and the sensed third voltage, where generating the digital feedback signal is based on the maximum or the minimum of the sensed first voltage and the sensed third voltage.

Figure 8:
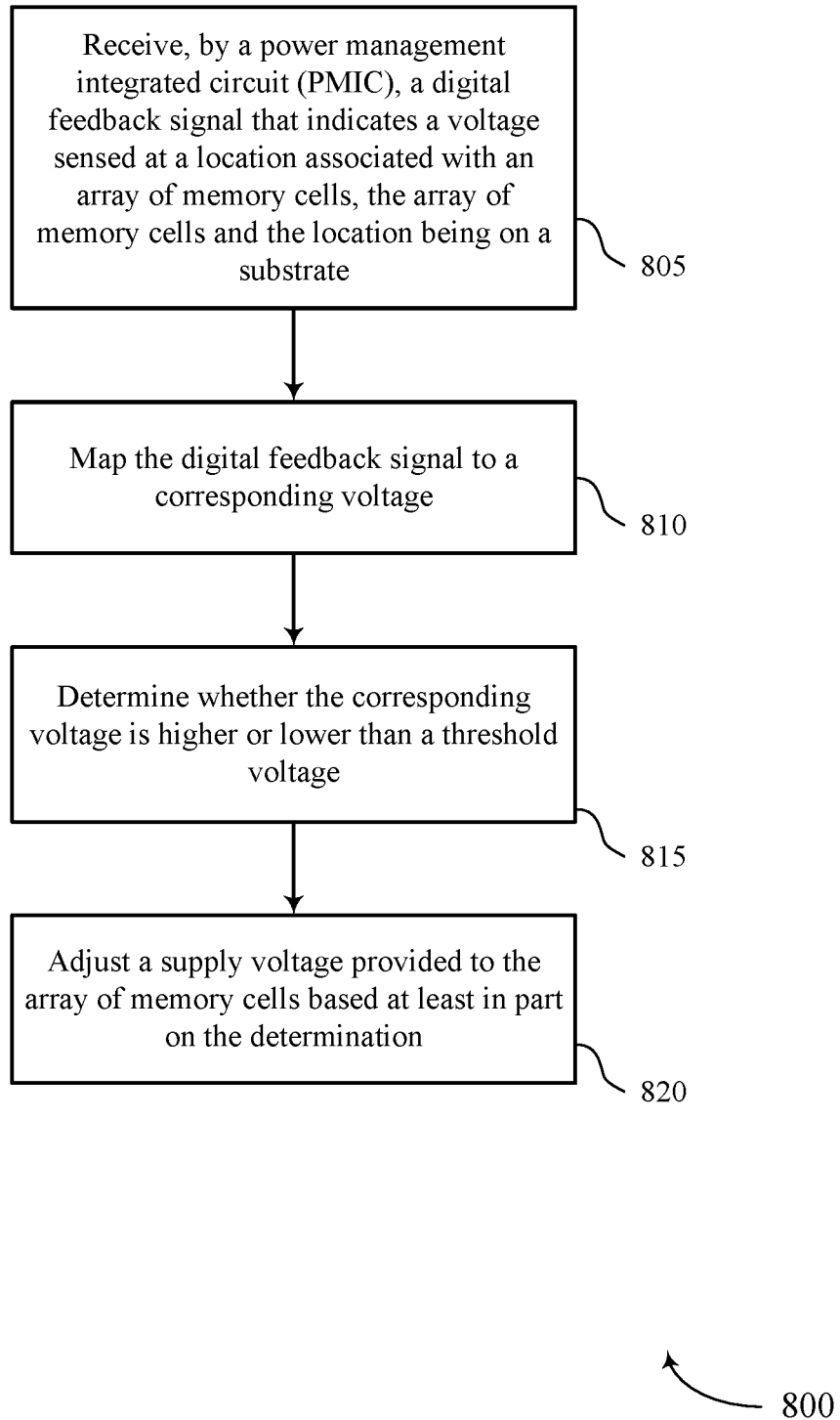

FIG. 8 shows a flowchart illustrating a method 800 that supports sensing and tuning for memory die power management as described herein. The operations of method 800 may be implemented by a PMIC or its components as described herein (e.g., a logic circuit of the PMIC). For example, the operations of method 800 may be performed by a PMIC as described with reference to FIGS. 1 through 5. In some examples, a PMIC may execute a set of instructions to control the functional elements of the PMIC to perform the functions described below. Additionally or alternatively, a PMIC may perform aspects of the functions described below using special-purpose hardware.

At 805, the PMIC may receive (e.g., from a memory device) a digital feedback signal that indicates a voltage sensed at a location associated with an array of memory cells, the array of memory cells and the location being on a substrate. The operations of 805 may be performed according to the methods described with reference to FIGS. 3 through 6. In some examples, aspects of the operations of 805 may be performed by a PMIC feedback manager as described with reference to FIG. 6.

At 810, the PMIC may map the digital feedback signal to a corresponding voltage. The operations of 810 may be performed according to the methods described with reference to FIGS. 3 through 6. In some examples, aspects of the operations of 810 may be performed by a PMIC mapping manager as described with reference to FIG. 6.

At 815, the PMIC may determine whether the corresponding voltage is higher or lower than a threshold voltage. The operations of 815 may be performed according to the methods described with reference to FIGS. 3 through 6. In some examples, aspects of the operations of 815 may be performed by a PMIC determination manager as described with reference to FIG. 6.

At 820, the PMIC may adjust a supply voltage provided to the array of memory cells based on the determination. The operations of 820 may be performed according to the methods described with reference to FIGS. 3 through 6. In some examples, aspects of the operations of 820 may be performed by a PMIC voltage adjustment manager as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for receiving a digital feedback signal that indicates a voltage sensed at a location associated with an array of memory cells, the array of memory cells and the location being on a substrate; mapping the digital feedback signal to a corresponding voltage; determining whether the corresponding voltage is higher or lower than a threshold voltage; and adjusting a supply voltage provided to the array of memory cells based on the determination.

In some examples of the method 800 and the apparatus described herein, the digital feedback signal comprises an indication of a quantity of pulses of a signal output by an oscillator on the substrate and the digital feedback signal is received from a counter on the substrate.

In some examples of the method 800 and the apparatus described herein, the location is within the array of memory cells.

It should be noted that the methods described herein describe possible implementations, and that the operations and the steps may be rearranged or otherwise modified and that other implementations are possible. Further, aspects from two or more of the methods may be combined.

Information and signals described herein may be represented using any of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
sensing, by a first sensor on a memory die, a first voltage at a location associated with a memory array on the memory die;
generating, by a feedback component on the memory die and based at least in part on the sensed first voltage, a digital feedback signal indicative of the first voltage sensed at the location;
transmitting the digital feedback signal from the feedback component to a pin of the memory die;
transmitting the digital feedback signal from the pin of the memory die to a power management integrated circuit (PMIC) for adjusting a second voltage supplied to the memory array; and
adjusting the second voltage based at least in part on a comparison of the digital feedback signal to a voltage threshold.

2. The method of claim 1, further comprising:
generating an analog voltage signal that indicates the first voltage, wherein the digital feedback signal is generated based at least in part on the analog voltage signal.

3. A method, comprising:
sensing, by a first sensor on a memory die, a first voltage at a location associated with a memory array on the memory die;
generating, by a feedback component on the memory die and based at least in part on the sensed first voltage, a digital feedback signal indicative of the first voltage sensed at the location;
transmitting the digital feedback signal from the feedback component to a pin of the memory die;
transmitting the digital feedback signal from the pin of the memory die to a power management integrated circuit (PMIC) for adjusting a second voltage supplied to the memory array
mapping the digital feedback signal to a corresponding voltage;
determining whether the corresponding voltage is higher or lower than a voltage threshold; and
adjusting the second voltage based at least in part on the determination.

4. The method of claim 1, further comprising:
sensing, using a second sensor on the memory die, a third voltage at a second location associated with the memory array, wherein generating the digital feedback signal is based at least in part on the sensed first voltage and the sensed third voltage.

5. The method of claim 4, further comprising:
determining an average of the sensed first voltage and the sensed third voltage, wherein generating the digital feedback signal is based at least in part on the average of the sensed first voltage and the sensed third voltage.

6. The method of claim 4, further comprising:
determining a maximum or a minimum of the sensed first voltage and the sensed third voltage, wherein generating the digital feedback signal is based at least in part on the maximum or the minimum of the sensed first voltage and the sensed third voltage.

7. A method, comprising:
sensing, by a first sensor on a substrate, a first voltage at a location associated with a memory array on the substrate;
adjusting a pulse frequency of a signal output by an oscillator on the substrate based at least in part on the sensed first voltage;
determining a quantity of pulses of the signal output by the oscillator over a time period;
generating, based at least in part on the quantity of pulses, a digital feedback signal indicative of the first voltage sensed at the location; and
transmitting the digital feedback signal to a power management integrated circuit (PMIC) for adjusting a second voltage supplied to the memory array.

8. The method of claim 7, further comprising:
determining the time period based at least in part on an accuracy threshold associated with the digital feedback signal.

9. The method of claim 7, further comprising:
determining the time period based at least in part on a latency threshold associated with the digital feedback signal.

10. An apparatus, comprising:
an array of memory cells on a memory die;
a pin of the memory die;
a voltage sensor on the memory die at a location associated with the array of memory cells; and
a feedback component on the memory die, the feedback component coupled with the pin and with the voltage sensor and configured to:
receive an analog signal from the voltage sensor,
generate a digital feedback signal based at least in part on the analog signal, and
transmit the digital feedback signal to the pin, wherein the apparatus is configured to
transmit the digital feedback signal from the pin of the memory die to a power management integrated circuit that is configured to provide a supply voltage to the array of memory cells and adjust the supply voltage provided to the array of memory cells based at least in part on the digital feedback signal.

11. The apparatus of claim 10, further comprising:
a second sensor on the memory die, the second sensor coupled with the array of memory cells and with the feedback component, wherein the feedback component is configured to receive a second analog signal from the second sensor and generate the digital feedback signal based at least in part on the second analog signal.

12. The apparatus of claim 10, wherein the voltage sensor is within the array of memory cells.

13. An apparatus, comprising:
an array of memory cells on a memory die;
a pin of the memory die;
a voltage sensor on the memory die at a location associated with the array of memory cells; and
a feedback component on the memory die, the feedback component coupled with the pin and with the voltage sensor and configured to:
receive an analog signal from the voltage sensor,
generate a digital feedback signal based at least in part on the analog signal, and
transmit the digital feedback signal to the pin, wherein the apparatus is configured to
transmit the digital feedback signal from the pin of the memory die to a power management integrated circuit that is configured to provide a supply voltage to the array of memory cells, wherein the feedback component comprises:
an oscillator configured to adjust a pulse frequency of a signal based on the analog signal; and
a counter coupled with the oscillator and configured to count a quantity of pulses of the signal over a first time period, wherein the digital feedback signal comprises an indication of the quantity of pulses.

14. The apparatus of claim 13, further comprising:
the power management integrated circuit configured to receive the digital feedback signal.

15. The apparatus of claim 14, wherein the power management integrated circuit is configured to:
map the quantity of pulses to a corresponding voltage; and
determine whether the corresponding voltage is higher or lower than a threshold voltage,
wherein the supply voltage provided to the array of memory cells is adjusted based at least in part on the determination.

16. An apparatus, comprising:
an array of memory cells on a memory die;
a pin of the memory die;
a voltage sensor on the memory die at a location associated with the array of memory cells; and
a feedback component on the memory die, the feedback component coupled with the pin and with the voltage sensor and configured to:
receive an analog signal from the voltage sensor,
generate a digital feedback signal based at least in part on the analog signal, and
transmit the digital feedback signal to the pin, wherein the apparatus is configured to
transmit the digital feedback signal from the pin of the memory die to a power management integrated circuit that is configured to provide a supply voltage to the array of memory cells, wherein the feedback component comprises:
a capacitor coupled with the voltage sensor and configured to provide a reference voltage based at least in part on the analog signal; and
an amplifier coupled with the capacitor and an oscillator, the amplifier configured to drive the oscillator based at least in part on the reference voltage provided by the capacitor.

17. A method, comprising:
receiving, by a power management integrated circuit (PMIC), a digital feedback signal that indicates a voltage sensed at a location associated with an array of memory cells, the array of memory cells and the location being on a substrate;
mapping the digital feedback signal to a corresponding voltage;
determining whether the corresponding voltage is higher or lower than a voltage threshold; and
adjusting a supply voltage provided to the array of memory cells based at least in part on the determination.

18. The method of claim 17, wherein the digital feedback signal comprises an indication of a quantity of pulses of a signal output by an oscillator on the substrate and the digital feedback signal is received from a counter on the substrate.

19. The method of claim 17, wherein the location is within the array of memory cells.

* * * * *